United States Patent
Raikin et al.

(10) Patent No.: US 11,249,724 B1
(45) Date of Patent: Feb. 15, 2022

(54) PROCESSING-MEMORY ARCHITECTURES PERFORMING ATOMIC READ-MODIFY-WRITE OPERATIONS IN DEEP LEARNING SYSTEMS

(71) Applicant: Habana Labs Ltd., Caesarea (IL)

(72) Inventors: Shlomo Raikin, Moshav Ofer (IL); Ron Shalev, Pardes Hana-Karkur (IL); Sergei Gofman, Haifa (IL); Ran Halutz, Ramat Hasharon (IL); Nadav Klein, Tel Aviv (IL)

(73) Assignee: HABANA LABS LTD., Caesarea (IL)

( * ) Notice: Subject to any disclaimer, the term of this patent is extended or adjusted under 35 U.S.C. 154(b) by 72 days.

(21) Appl. No.: 16/553,454

(22) Filed: Aug. 28, 2019

Related U.S. Application Data

(60) Provisional application No. 62/736,518, filed on Sep. 26, 2018.

(51) Int. Cl.
| | | |
|---|---|---|
| *G06F 9/30* | (2018.01) | |
| *G06F 7/57* | (2006.01) | |
| *G06F 7/505* | (2006.01) | |
| *G11C 11/409* | (2006.01) | |
| *G06F 7/46* | (2006.01) | |

(52) U.S. Cl.
CPC ............ *G06F 7/57* (2013.01); *G06F 7/462* (2013.01); *G06F 7/505* (2013.01); *G06F 9/3001* (2013.01); *G06F 9/3004* (2013.01); *G06F 9/30087* (2013.01); *G11C 11/409* (2013.01)

(58) Field of Classification Search
CPC ................ G06F 9/3004; G06F 9/30087
See application file for complete search history.

(56) References Cited

U.S. PATENT DOCUMENTS

| | | | | |
|---|---|---|---|---|
| 5,546,333 A | * | 8/1996 | Smith ............ | G06F 7/556 380/30 |
| 6,470,374 B1 | * | 10/2002 | Jin ............ | G06F 7/508 708/700 |
| 7,664,810 B2 | * | 2/2010 | Crispin ............ | G06F 9/3001 708/491 |
| 2003/0200423 A1 | * | 10/2003 | Ehlig ............ | G06F 9/30065 712/228 |
| 2006/0221978 A1 | * | 10/2006 | Venkatachalam ... | H04L 47/6255 370/395.41 |
| 2011/0072066 A1 | * | 3/2011 | Lutz ............ | G06F 7/483 708/497 |
| 2011/0078406 A1 | * | 3/2011 | Nickolls ............ | G06F 12/0284 711/202 |
| 2014/0195852 A1 | * | 7/2014 | Gollub ............ | G11C 29/10 714/33 |
| 2014/0379953 A1 | * | 12/2014 | Heyrman ............ | G06F 13/1689 710/308 |
| 2017/0235557 A1 | * | 8/2017 | Dang ............ | G06F 8/52 717/153 |
| 2018/0075339 A1 | | 3/2018 | Ma et al. | |
| 2018/0293491 A1 | | 10/2018 | Ma et al. | |

OTHER PUBLICATIONS

Shalev et al., U.S. Appl. No. 16/150,299, filed Oct. 3, 2018.

* cited by examiner

*Primary Examiner* — Jacob Petranek
(74) *Attorney, Agent, or Firm* — Kligler & Associates Patent Attorneys Ltd

(57) ABSTRACT

A computational apparatus includes a memory unit and Read-Modify-Write (RMW) logic. The memory unit is configured to hold a data value. The RMW logic, which is coupled to the memory unit, is configured to perform an atomic RMW operation on the data value stored in the memory unit.

20 Claims, 2 Drawing Sheets

PROCESSING-MEMORY ARCHITECTURES PERFORMING ATOMIC READ-MODIFY-WRITE OPERATIONS IN DEEP LEARNING SYSTEMS

CROSS-REFERENCE TO RELATED APPLICATIONS

This application claims the benefit of U.S. Provisional Patent Application 62/736,518, filed Sep. 26, 2018, whose disclosure is incorporated herein by reference.

FIELD OF THE INVENTION

The present invention relates generally to processor and/or memory architectures for deep learning, and particularly to processor and/or memory architectures for performing mathematical operations in deep learning applications.

BACKGROUND OF THE INVENTION

Techniques to increase computation efficiency in deep learning were previously proposed in the patent literature. For example, U.S. Patent Application Publication 2018/0075339 describes a memory-centric neural network system and operating method thereof that include a processing unit and semiconductor memory devices coupled to the processing unit. The semiconductor memory devices contain instructions executed by the processing unit. The memory further includes weight matrixes including a positive weight matrix and a negative weight matrix constructed with rows and columns of memory cells, inputs of the memory cells of a same row are connected to one of Axons, outputs of the memory cells of a same column are connected to one of Neurons; timestamp registers registering timestamps of the Axons and the Neurons; and a lookup table containing adjusting values indexed in accordance with the timestamps. The processing unit updates the weight matrixes in accordance with the adjusting values.

As another example, U.S. Patent Application Publication 2018/0293491 describes a mechanism for facilitating fast data operations for machine learning at autonomous machines. A method of embodiments, as described herein, includes detecting input data to be used in computational tasks by a computation component of a compute pipeline of a processor including a graphics processor. The method may further include determining one or more frequently-used data values from the data, and pushing the one or more frequent data values to bypass the computational tasks.

SUMMARY OF THE INVENTION

An embodiment of the present invention provides a computational apparatus including a memory unit and Read-Modify-Write (RMW) logic. The memory unit is configured to hold a data value. The RMW logic, which is coupled to the memory unit, is configured to perform an atomic RMW operation on the data value stored in the memory unit.

In some embodiments, the memory unit and the RMW logic are disposed on a same semiconductor die. In other embodiments, the memory unit and the RMW logic are disposed on different semiconductor dies.

In some embodiments, the computational apparatus further includes synchronization logic, configured to synchronize the RMW logic to perform the atomic RMW operation.

In an embodiment, the atomic RMW operation includes a sum-reduction.

In another embodiment, the RMW logic includes an Arithmetic Logic Unit (ALU) and ancillary circuitry, which are configured to atomically read the data value from the memory unit, compute a sum of the data value and an additional data value, and write the sum back to the memory unit.

In an embodiment, the atomic RMW operation includes a product-reduction.

In another embodiment, the RMW logic includes a multiplier and ancillary circuitry, which are configured to atomically read the data value from the memory unit, compute a product of the data value and an additional data value, and write the product back to the memory unit.

In some embodiments, the memory unit includes a Static Random-Access memory (SRAM).

In some embodiments, the memory unit includes a Dynamic Random-Access Memory (DRAM).

There is additionally provided, in accordance with an embodiment of the present invention, a method including holding a data value in a memory unit. An atomic Read-Modify-Write (RMW) operation is performed on the data value stored in the memory unit, using logic that is coupled to the memory unit.

The present invention will be more fully understood from the following detailed description of the embodiments thereof, taken together with the drawings in which:

DETAILED DESCRIPTION OF EMBODIMENTS

Overview

Figure 1:
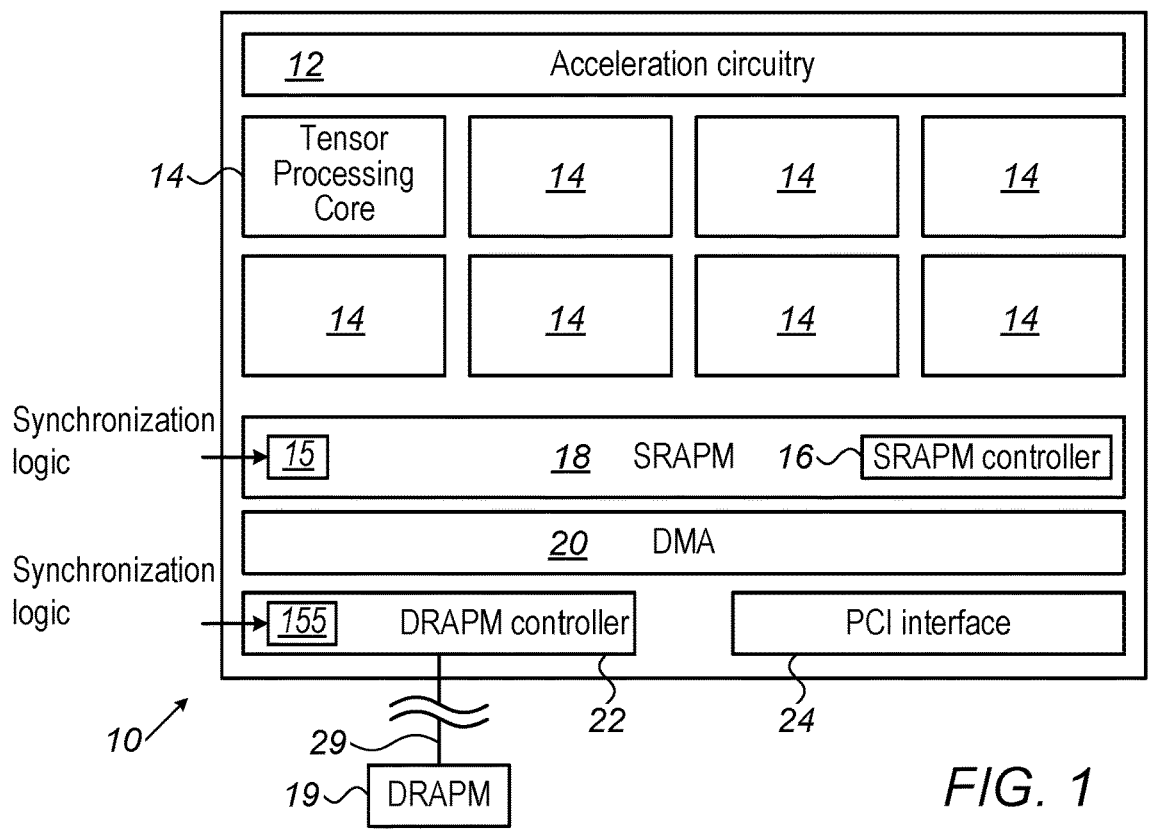
FIG. 1 is a block diagram that schematically illustrates a processor that is configured to run deep-neural-network (DNN) models, according to an embodiment of the present invention.

Mathematical operations, such as summation or multiplication of elements of an array, are common in many engineering fields, such as deep learning. Typically, in iterative calculation types, summation or multiplication are done repeatedly, and intermediate results are written to a memory, with the algorithm repeatedly invoking a computing resource, such as a processor. In each iteration, the processor needs to read the intermediate results from the memory, perform the summation or multiplication, and write the result back to the memory. This process may consume significant amounts of memory and may interrupt the processor from performing other tasks.

For example, in deep learning, summations (also referred to as "sum reductions") are done repeatedly during iterative calculations of operands, such as weights of a network, with the aim of minimizing a network loss function. In such calculations, the values of the weights are updated at various network locations by the processor after the processor applies sum reduction for their gradients. In each iteration of the calculation, the processor writes intermediate gradients to a memory. Then, the processor reads the intermediate gradient values from the memory, performs the sum reduction, and writes the result back to the memory. After summation is done, the process of Weight-Update (calculating the updated values of the weights) is being invoked. When Weight-Update is done, new weights are ready and another neural-network training iteration can start. While being preoccupied in performing the above tasks, the processor has limited capacity to handle additional tasks, and the limited capacity may cause delays.

Embodiments of the present invention that are described hereinafter provide processing-memory architectures in which processing elements are part of a memory architecture and employ read-modify-write (RMW) commands into the memory in order to realize efficient mathematical computations, such as those required in deep learning. In some embodiments, the processing elements that perform the RMW operations are physically integrated with the memory on a same chip.

RMW is a class of processor operations, such as fetch-and-add, that both read a memory location and write a new value to the location "atomically" (i.e., without any possibility for another operation to intervene between the read, the modify and the write). The new value may be either a completely new value or some function of the previous value. An RMW mode of operation may prevent a "race condition," where several processes compete for a shared processor resource in multi-threaded processing applications, such as in network calculations used in deep learning. Specifically, in Deep Learning, the work may also be distributed to multiple nodes (paradigm known is Data-Parallelism), all competing to update gradient memory in a single node serving as the Parameter-Server)

In some embodiments, instead of writing the operands (e.g., gradient values of a loss function) to separate locations in memory, all workers write the operands (e.g., gradients) to the same location in the memory. The write action carries a "perform Read-Modify-Write" attribute instead of just a "Write" attribute. The processing-memory location at which the sum reduction is performed serves as a synchronization point, such that when multiple computation processes generate gradients concurrently, the gradients are all written to this single processing-memory location in a thread-safe manner using a synchronization logic connected to the processing-memory location.

In other embodiments, race conditions are avoided by delaying a second RMW operation to the same location. In another embodiment, race conditions are avoided by performing RMW operations at the same speed allowed by the memory block interface. In all these cases, both the above computation and synchronization steps happen entirely in hardware. Examples of memory hardware in use include, for example, on-die SRAM, or an external memory, as described below. As another example, DRAM-based solutions may also be used.

In an embodiment, while a sum-reduction or a product-reduction operation is in progress, a disclosed processing-memory architecture comprising SRAM memory holds any other operations in the memory location until the reduction operation is completed, thereby preventing resource contention on the memory. Such an embodiment also guarantees serialization between two consecutive reduction operations and between a reduction operation and other types of operations.

In another embodiment, a set of commanding parameters is defined for managing consecutive accesses to a row buffer of a DRAM memory: regular "Read," "Write," and "Reduction" operations, such that sufficient time is allocated in order to perform the required arithmetic operations without causing data collisions.

To conclude, the disclosed computational apparatuses typically include (a) a semiconductor die, (b) a memory unit, which is disposed on the die and is configured to hold a data value, and (c) RMW logic, which is disposed on the die and coupled to the memory unit, and is configured to perform an atomic RMW operation on the data value stored in the memory unit. The atomic RMW operation may comprise a sum-reduction, a product-reduction or a min/max reduction. To perform the atomic RMW operations, the RMW logic may include an ALU (or a multiplier) and ancillary circuitry, which are configured to atomically read the data value from the memory unit, compute a sum (or a product/min/max), of the data value and an additional data value, and write the sum (or product or min/max) back to the memory unit. The memory unit may include a Static Random-Access Memory (SRAM) and/or a Dynamic Random-Access Memory (DRAM).

In general, the disclosed processing memories are programmed in software containing a particular algorithm that enables the processing memories to conduct each of the disclosed processing-memory architecture related steps and functions outlined above.

The disclosed processing-memory architectures for sum-reduction applications may improve the performance of deep-learning-based products, such as artificial intelligence products based on any kind of learning methods (for example: supervised, unsupervised and reinforcement learning). Moreover, when configured to perform other mathematical operations, such as product reduction, the disclosed processing-memory architectures may improve the performance of other types of computation-demanding products.

System Description

FIG. 1 is a schematic, pictorial illustration of a processor 10 that is configured to run deep-neural-network (DNN) models, according to an embodiment of the present invention. In the present example processor 10 is optimized for machine-learning (ML), aimed at ML inference chores and/or ML training. The architecture of processor 10 is based on multiple Tensor Processing Cores (TPC) 14 that are fully programmable in C and C++. Generally, however, the disclosed techniques are applicable in a wide variety of applications and processor architectures.

Processor 10 can process tensors, as described, for example, in U.S. patent application Ser. No. 16/150,299, filed Oct. 3, 2018, which is assigned to the assignee of the present patent application and whose disclosure is incorporated herein by reference.

In the shown embodiment, processor 10 comprises a cluster of eight TPCs 14 that are fully programmable, for example in C and C++. Each TPC 14 may handle up to 32-bit integers as well as 32-bit floating point values. Processor further comprises general-matrix-multiply (GEMM) acceleration circuitry 12.

Processor 10 is further capable of special functions in dedicated hardware along with tensor addressing and latency-hiding support. Such functions may include real-time tracing and performance analysis that can be graphically presented.

Processor 10 comprises an on-die shared static random-access processing-memory (SRAPM) 18 that is managed by software along with centralized, programmable direct-memory access elements (DMAs) 20 to deliver predictable, low-latency operation. Each SRAPM 18 comprises a synchronization logic 15 and a control circuitry 16 within SRAPM 18, which is also called hereinafter "SRAPM controller 16."

DMA 20 also allows certain hardware subsystems to access a main system memory (random-access memory—not shown in the figure), independently of TPCs 14. Processor 10 further comprises a PCI interface 24.

As seen, a dynamic random-access processing-memory (DRAPM) 19, which is disposed on a separate die, is connected via a link 29 to an on-die control circuitry 22, also called hereinafter "DRAPM controller 22," in processor 10. As seen, DRAPM controller 22 comprises a synchronization logic 155 of its own.

Processor 10 typically runs software that is configured to run DNN models and utilize user-supplied libraries. In some embodiments, for example, processor 10 may be optimized to run a supervised learning method that includes minimizing a loss L(w) of the following form:

$$L(w) = \frac{1}{|X|}\sum_{x \in X} l(x, w),  \quad \text{Eq. 1}$$

where w represents the weights of a network, X is a labeled training set comprising a number |X| of elements, and l(x,w) is the loss computed from samples x∈X and their labels y.

Typically, l(x, w) consists of a prediction loss (e.g., cross-entropy loss) and a regularization loss on w. Minibatch Stochastic Gradient Descent (Minibatch SGD), usually referred to as simply as SGD in recent literature (even though it operates on minibatches), performs the following update:

$$w(t+1) = w(t) - \alpha\frac{1}{n}\sum_{x \in B} \nabla l(x, w(t)), \quad \text{Eq. 2}$$

where B is a minibatch sampled from X and n=|B| is the minibatch size, α is the learning rate and t is the iteration index.

As seen in Eq. 2, the gradient of the loss from the different examples within the minibatch (namely, ∇l(x,w(t))) should be sum-reduced before further computation can be done. The SGD calculation above is chosen purely by way of example, to demonstrate a calculation involving sum-reduction that can be performed efficiently using the disclosed techniques. The techniques described herein are in no way limited to SGD or to any specific calculation.

In some embodiments of the present invention, the sum reduction is performed directly in SRAPM 18 and/or DRAPM of processor 10, as further described below. Thus, embodiments described below describe on-die processing memory (i.e., SRAPM 18) and processing-memory architectures implemented on a separate die (i.e., DRAPM 19) and also in another type of system memory (such as by including processing-memory elements within DDR or High Bandwidth Memory (HBM) architectures, with their controller included in processor 10). Furthermore, in general, the disclosed processing-memory architectures can be implemented in any processing element in a system, for example the host's CPU or in a GPU, so as to expedite calculations that involve repeatedly making sum reductions.

In some embodiments, when calculating the gradients of each loss sample x, x∈B, all iterations write gradients to the same location in memory. The write carries an attribute saying "perform Read-Modify-Write" instead of just "Write." The memory location performing the reduction (either on-die SRAM or external memory, e.g., one of DDR, HBM, GDDR) serves as a synchronization point, such that when multiple agents generate gradients concurrently, they can all write to this single location in a thread-safe manner. This can happen either by delaying a second RMW operation to the same location or performing RMW operations at the same speed allowed by the memory block interface. Both computation and synchronization take place completely in hardware.

In general, the disclosed processing-memory architectures can be implemented in situations in which multiple agents generate gradients concurrently. The multiple agents comprising the disclosed processing-memory elements can be different processing elements (PEs) in the same chip or different PEs in different chips, or a combination of the two.

Reduction can take place on a scalar data type (for example a 32-bit floating-point value) or a vector data type (for example sixteen different 32-bit floating-point numbers). Vector operation follows the SIMD (Single Instruction Multiple Data) programming paradigm. As memory is normally arranged in cache lines, a vector-reduction operation of cache line size maps naturally to the way memory is managed.

Following the process described above, a single memory location holds all intermediate gradients, thus saving memory capacity. After the last iteration, n, the memory holds the sum-reduced gradients, and no computing entity has been interrupted to perform the reduction. In terms of pseudocode this is described as follows: at any given t, for n in |B|, {sum+=∇l(x(n),w(t))//summation takes-place directly in memory}.

In some embodiments, mutatis mutandis, the disclosed techniques are implemented for, expediting other mathematical operations, such as product reduction. For example, the disclosed technique may be utilized to perform a product-reduction calculation in the form of:

$$P(m+1) = P(m) + \gamma f\left[\prod_{j=1}^{N}(P(j,m))\right] \quad \text{Eq. 3}$$

on a set size N of numbers {$P_j$}, with m being the iteration index, γ a convergence rate, and f a function of a product to be reduced, such as, by way of example, a binomial coefficient.

Processor 10 is designed to manage high-throughput chores with low latency and at low power requirements. For example, processor 10 can process a DNN model at over 15,000 images/s with a 1.3-ms latency while dissipating 100 W of power. Processor 10 may be passively or actively cooled.

Processing-Memory Architectures in Deep-Learning Systems

Figure 2:
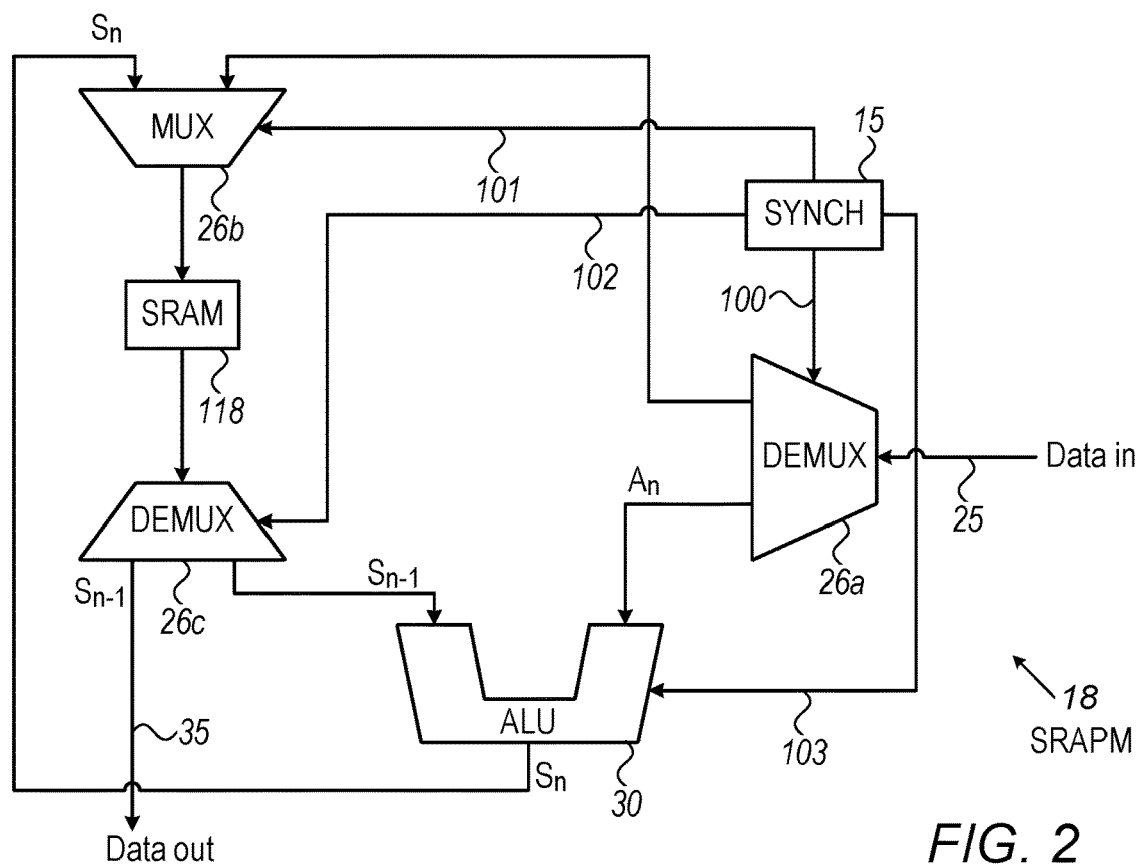
FIG. 2 is a block diagram that schematically illustrates a shared static random-access processing memory (SRAPM) of the processor of FIG. 1, which is configured to perform sum reduction, according to an embodiment of the present invention.
Figure 3:
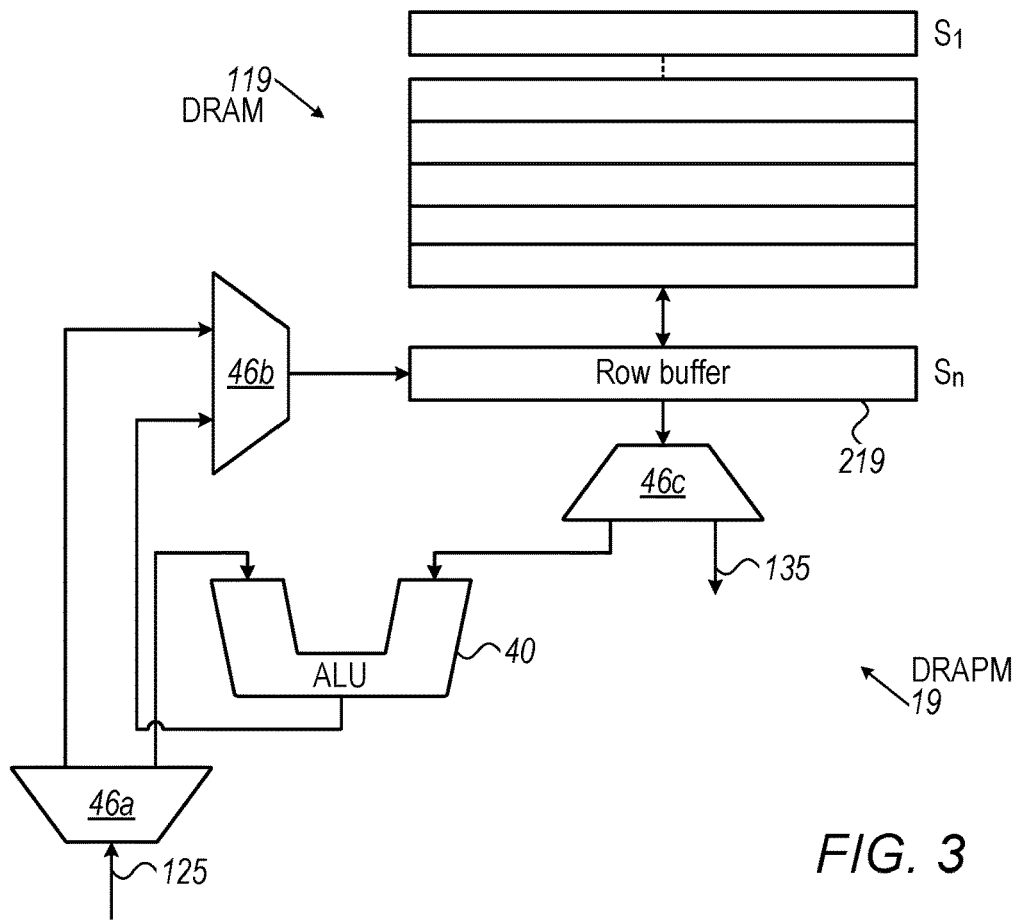
FIG. 3 is a block diagram that schematically illustrates a dynamic random-access processing memory (DRAPM) of the processor of FIG. 1, which is configured to perform sum reduction, according to an embodiment of the present invention.

FIG. 2 and FIG. 3 below describe embodiments of the disclosed processing-memory architectures configured to perform sum reduction in SRAM or in DRAM locations (also referred to as "memory units"), respectively. In the present context, the term "memory unit" refers to a group of memory cells that are identified by an address and are used for storing a data value.

Specifically, the shown embodiments are configured to perform the sum reduction described above by Eq. 2. Both in SRAM and in DRAM, sum reduction relies on an RMW capability for reading the current data stored in memory, performing an arithmetic logic unit (ALU) operation (e.g., summation), and writing the result back to memory.

An SRAM is normally instantiated as part of an on-die network on chip (NoC) that uses backpressure. If a sum reduction operation is in progress, one possible implementation is to halt any other operation to that memory location until the reduction operation is done, thereby preventing contention on the memory. This option also guarantees serialization between two consecutive reduction operations and between a reduction operation and other operation types. If speculative execution of operations is possible (for example, reading from SRAM while performing the ALU operation), address comparison is required to provide the required serialization: a subsequent operation (Read, Write or Reduction) must observe the side effect of a preceding reduction operation.

FIG. 2 is a block diagram that schematically illustrates a shared static random-access processing memory (SRAPM) 18 of processor 10 of FIG. 1, which is configured to perform sum reduction, according to an embodiment of the present invention. As seen, SRAPM 18 comprises SRAM 118 that stores a partial sum $S_{n-1}$.

At a given instance, an input data 25 comprising a new element of the required sum, $A_n$, (e.g., a gradient generated by an agent) is received by SRAPM 18 and, using synchronization logic 15, an RMW action by SRAPM 18, in which SRAPM 18 generates sum $S_n$, and stores sum $S_n$ in SRAM 118.

As seen, a control signal 100 from synchronization logic 15 controls a demultiplexer 26a to output $A_n$ to an ALU 30. Synchronization logic 15 also outputs a control signal 101 to a multiplexer 26b. In response to control signal 101, multiplexer 26b opens a write channel to SRAM 118.

In a specific implementation, it takes several clock cycles for data to be read from SRAM 118 to ALU 30. This implies that data-in 25 needs to be staged for that number of clock cycles until $A_n$ is outputted to ALU 30. It also implies that MUX 26b needs to receive a control signal choosing the path writing $S_n$ from ALU 30 to SRAM 118 only at a next clock cycle. A control signal 102 from synchronization logic 15 controls demultiplexer 26c to access the sum $S_{n-1}$ stored in SRAM 118 (i.e., to have SRAM 118 read), and to route the read sum $S_{n-1}$ to an ALU 30 for ALU 30 to, which, in response to a control signal 103, calculate $S_n$ by summing $S_{n-1}$ with $A_n$. In parallel to routing sum $S_{n-1}$ to ALU 30, demultiplexer 26c may, in some embodiments, output (35) sum $S_{n-1}$ for use, for example, by other elements of processor 10.

In the present example, the atomic RMW logic comprises demultiplexer 26a, multiplexer 26b, demultiplexer 26c and ALU 30. SRAM 118 serves as the memory unit associated with the atomic RMW logic.

In other embodiments, to prevent possible contention on the memory while the sum-reduction operation is in progress, all other operations are held off from that memory location until the reduction operation is done. This option also guarantees serialization between two consecutive reduction operations and between a reduction operation and another type of operation.

After SRAM 118 is read, it is ready to receive a new entry, i.e., sum $S_n$, to store, generated by ALU 30. Thus, at the same RMW step, the output of ALU 30 summation operation, $S_n$, is stored in (i.e., written into) SRAM 118.

FIG. 3 is a block diagram that schematically illustrates a dynamic random-access processing-memory (DRAPM) 19 of processor 10 of FIG. 1, which is configured to perform sum reduction, according to an embodiment of the present invention. The RMW process in FIG. 3 follows, in response to control signals from synchronization logic 155 (shown in FIG. 1) the same RMW process described in FIG. 2, differing only by the type of memory in use. An input 125 and an output 135 correspond to input 25 and output 35 of FIG. 2, respectively.

FIG. 3 shows a DRAM bank 119 with additional logic elements: an ALU 40 performing the reduction and a new data path comprising mux/demux elements 46a-c. Such logic elements are typically added to each bank 119 in DRAPM 19.

As the sum-reduction operation will use a new command, a new set of parameters is defined for managing consecutive accesses to a row buffer 219: regular "Read," "Write," and "Reduction" operations, such that sufficient time is allocated to perform the ALU operations and to prevent the occurrence of data collisions.

In the present example, the atomic RMW logic comprises demultiplexer 46a, multiplexer 46b, demultiplexer 46c and ALU 40. Row buffer 219 serves as the memory unit associated with the atomic RMW logic.

In an embodiment, a memory controller (not shown) holds different parameters managing access to row buffer 219 holding the current active page. An example of such a parameter is column latency (CL) regulating two consecutive accesses to the same page.

In an embodiment, backward compatibility is supported so that a legacy memory controller that doesn't implement the new RMW command will be able to work normally within the disclosed computing-memory architecture.

Also with DRAPM, a correctness rule, in which a more recent operation must observe the side effect of an older reduction, can be enforced by serialization or by some sort of address matching.

The SRAPM and DRAPM architectures shown in FIGS. 2 and 3 are brought by way of example, whereas other implementations may occur to a person skilled in the art.

Figure 4:
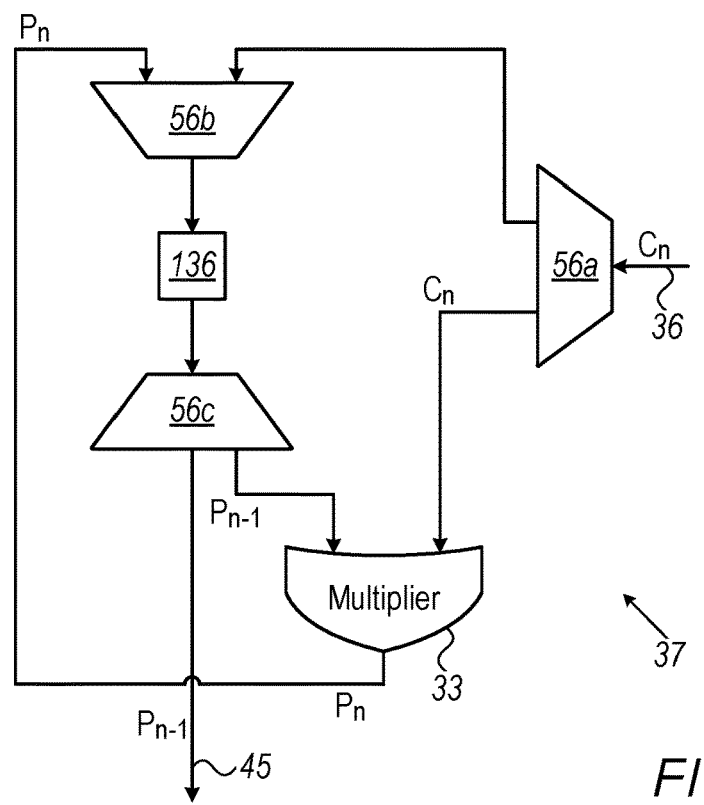
FIG. 4 is a block diagram that schematically illustrates a static random-access processing memory (SRAPM) of the processor of FIG. 1, which is configured to perform product reduction, according to an embodiment of the present invention.

FIG. 4 is a block diagram that schematically illustrates a static random-access processing-memory (SRAPM) 37 of processor 10 of FIG. 1, which is configured to perform product reduction, according to an embodiment of the present invention. The shown embodiment is configured to perform a product reduction such as described above by Eq. 3.

As seen, the RMW process in FIG. 4 follows the RMW process described in FIG. 2, including using an SRAM 136, differing only by the type of arithmetic operator used (i.e., multiplier 33 instead of ALU 30). In FIG. 4, a multiplier 33 calculates a product $P_n$ by multiplying product $P_{n-1}$ with a new element $C_n$ that is comprised in input data 36. Control signals (not shown) are used in the same manner as control signal 28 of FIG. 2.

In FIG. 4 elements 46a-c correspond to elements 26a-c of FIG. 2. As seen, demultiplexer 56c routes products $P_{n-1}$ to multiplier 33 to calculate $P_n$ by multiplying product $P_{n-1}$ with $C_n$. In parallel to routing product $P_{n-1}$ to multiplier 33, demultiplexer 56c may, in some embodiments, output (45) product $P_{n-1}$ for use, for example, by other elements of processor 10.

In the present example, the atomic RMW logic comprises demultiplexer 56a, multiplexer 56b, demultiplexer 56c and multiplier 33. SRAM 136 serves as the memory unit associated with the atomic RMW logic.

The configurations of the disclosed processing-memory architectures, which are described hereinabove, are example configurations that are shown purely for the sake of conceptual clarity. Any other suitable configurations can be used in alternative embodiments. The different elements of the disclosed processing-memory architectures may be implemented using suitable hardware, such as in one or more Application-Specific Integrated Circuits (ASICs) or Field-Programmable Gate Arrays (FPGAs), using software, using hardware, or using a combination of hardware and software elements.

In some embodiments, the disclosed processing-memory architectures comprise programmable processors, which are programmed in software to carry out the functions described herein. The software may be downloaded to the processors in electronic form, over a network or from a host, for example, or it may, alternatively or additionally, be provided and/or stored on non-transitory tangible media, such as magnetic, optical, or electronic memory.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A processing-memory circuit, comprising:
a data input interface, configured to receive a sequence of input data values for a data reduction operation;
an operation unit, configured to apply the data reduction operation;
a memory element, which is identified by an address; and
Read-Modify-Write (RMW) logic, which is coupled to the memory element and to the operation unit, and is configured to perform a sequence of iterations including, in each iteration, atomically (i) reading a previous result of the data reduction operation from the address, (ii) applying the data reduction operation to the previous result and to a next input data value using the operation unit, thereby generating a next result, and (iii) writing the next result of the data reduction operation back to the address,
wherein the RMW logic comprises:
a demultiplexer connected to input the previous result from the memory element to the operation unit and to output the previous result from the circuit; and
a multiplexer connected to input the next result from the operation unit to the memory element, so as to serve as the previous result in a next iteration in the sequence.

2. The processing-memory circuit according to claim 1, wherein the memory element, the operation unit, and the RMW logic are disposed on a same semiconductor die.

3. The processing-memory circuit according to claim 1, wherein the memory element and the RMW logic are disposed on different semiconductor dies.

4. The processing-memory circuit according to claim 1, wherein the RMW logic comprises synchronization logic, configured to synchronize the RMW logic to perform the data reduction operation.

5. The processing-memory circuit according to claim 1, wherein the data reduction operation comprises a sum-reduction.

6. The processing-memory circuit according to claim 5, wherein the operation unit comprises an Arithmetic Logic Unit (ALU).

7. The processing-memory circuit according to claim 1, wherein the data reduction operation comprises a product-reduction.

8. The processing-memory circuit according to claim 7, wherein the operation unit comprises a multiplier.

9. The processing-memory circuit according to claim 1, wherein the memory element comprises a Static Random-Access memory (SRAM) element.

10. The processing-memory circuit according to claim 1, wherein the memory element comprises a Dynamic Random-Access Memory (DRAM) element.

11. The processing-memory circuit according to claim 1, wherein the data input interface comprises a demultiplexer, which is connected to input the next data value to the operation unit and to the multiplexer for input to the memory element.

12. A method, comprising:
receiving a sequence of input data values for a data reduction operation; and
performing a sequence of iterations using Read-Modify-Write (RMW) logic, which is coupled to a memory element that is identified by an address and to an operation unit that is configured to apply the data reduction operation, including, in each iteration, atomically (i) reading a previous result of the data reduction operation from the address, (ii) applying the data reduction operation to the previous result and to a next input data value using the operation unit, thereby generating a next result, and (iii) writing the next result of the data reduction operation back to the address,
wherein the RMW logic comprises:
a demultiplexer connected to input the previous result from the memory element to the operation unit and to output the previous result from the circuit; and
a multiplexer connected to input the next result from the operation unit to the memory element, so as to serve as the previous result in a next iteration in the sequence.

13. The method according to claim 12, wherein applying the data reduction operation comprises synchronizing the RMW logic by synchronization logic.

14. The method according to claim 12, wherein the data reduction operation comprises a sum-reduction.

15. The method according to claim 14, wherein applying the sum-reduction comprises computing, using an Arithmetic Logic Unit (ALU), a sum of the previous result and the next input data value.

16. The method according to claim 12, wherein the data reduction operation comprises a product-reduction.

17. The method according to claim 16, wherein applying the product-reduction comprises computing, using a multiplier, a product of the previous result and the next input data value.

18. The method according to claim 12, wherein the memory element comprises a Static Random-Access Memory (SRAM) element.

19. The method according to claim 12, wherein the memory element comprises a Dynamic Random-Access Memory (DRAM) element.

20. The method according to claim 12, wherein receiving the sequence of input data values comprises demultiplexing the input data values so as to input the next data value to the operation unit and to the multiplexer for input to the memory element.

\* \* \* \* \*